US010979013B2

(12) United States Patent
Chen et al.

(10) Patent No.: US 10,979,013 B2
(45) Date of Patent: Apr. 13, 2021

(54) METHOD OF MANUFACTURING PIEZOELECTRIC THIN FILM RESONATOR ON NON-SILICON SUBSTRATE

(71) Applicant: SHANDONG UNIVERSITY OF SCIENCE AND TECHNOLOGY, Qingdao (CN)

(72) Inventors: Da Chen, Qingdao (CN); Hongfei Wang, Qingdao (CN); Peng Wang, Qingdao (CN); Xiaojun Zhang, Qingdao (CN); Zhongli Li, Qingdao (CN)

(73) Assignee: SHANDONG UNIVERSITY OF SCIENCE AND TECHNOLOGY, Qingdao (CN)

( * ) Notice: Subject to any disclaimer, the term of this patent is extended or adjusted under 35 U.S.C. 154(b) by 0 days.

(21) Appl. No.: 16/978,950

(22) PCT Filed: May 5, 2019

(86) PCT No.: PCT/CN2019/085437
§ 371 (c)(1),
(2) Date: Sep. 8, 2020

(87) PCT Pub. No.: WO2020/199299
PCT Pub. Date: Oct. 8, 2020

(65) Prior Publication Data
US 2021/0050836 A1    Feb. 18, 2021

(30) Foreign Application Priority Data

Mar. 29, 2019  (CN) .......................... 201910248954.7

(51) Int. Cl.
H03H 9/17    (2006.01)
H03H 3/02    (2006.01)
(Continued)

(52) U.S. Cl.
CPC .......... *H03H 3/02* (2013.01); *H01L 41/0815* (2013.01); *H01L 41/27* (2013.01); *H01L 41/314* (2013.01); *H01L 41/332* (2013.01)

(58) Field of Classification Search
CPC ......... H03H 3/02; H01L 41/27; H01L 41/314; H01L 41/332; H01L 41/0815
See application file for complete search history.

(56) References Cited

FOREIGN PATENT DOCUMENTS

CN    106788318 A    5/2017
CN    107068607 A    8/2017

OTHER PUBLICATIONS

International Search Report issued in corresponding International Application No. PCT/CN2019/085437, dated Dec. 30, 2019, The State Intellectual Property Office of the P.R. China, Beijing, China.
(Continued)

*Primary Examiner* — Emily P Pham
*Assistant Examiner* — Monica Mata
(74) *Attorney, Agent, or Firm* — Hauptman Ham, LLP

(57) ABSTRACT

Disclosed is a method of manufacturing a piezoelectric thin film resonator on a non-silicon substrate, including the following steps: depositing a copper thin film on a silicon wafer; coating photoresist on the copper thin film to perform photoetching so as to remove photoresist in an air gap region under the piezoelectric thin film resonator to be disposed; electroplating-depositing a copper layer, and removing photoresist to obtain a stepped peel sacrifice layer; coating polyimide and performing imidization by heat treatment, making a sandwich structure of the piezoelectric thin film resonator above the polyimide layer; performing etching for the polyimide layer in a region not covered by the piezoelectric thin film resonator by oxygen plasma; placing the obtained device into a copper corrosion solution to dissolve the copper around and under the piezoelectric thin film (Continued)

resonator, attaching a drum coated with polyvinyl alcohol glue onto the piezoelectric thin film resonator, releasing and peeling it from the silicon wafer and then transferring it to a desired non-silicon substrate; washing the drum with hot water to separate the drum from the piezoelectric thin film resonator so as to complete the manufacturing process.

10 Claims, 2 Drawing Sheets

(51) Int. Cl.
    *H01L 41/08*     (2006.01)
    *H01L 41/332*     (2013.01)
    *H01L 41/314*     (2013.01)
    *H01L 41/27*     (2013.01)

(56) References Cited

OTHER PUBLICATIONS

Written Opinion issued in corresponding International Application No. PCT/CN2019/085437, dated Dec. 30, 2019, The State Intellectual Property Office of the P.R. China, Beijing, China.
Chinese Search Report issued in corresponding Chinese Patent Application No. 2019102489547, dated Mar. 13, 2020.
Chinese Office Action issued in corresponding Chinese Patent Application No. 2019102489547, dated Mar. 20, 2020.
Notification to Grant Patent Right for Invention issued in corresponding Chinese Patent Application No. 2019102489547, dated Apr. 28, 2020.

METHOD OF MANUFACTURING PIEZOELECTRIC THIN FILM RESONATOR ON NON-SILICON SUBSTRATE

RELATED APPLICATIONS

The present application is a U.S. National Phase of International Application Number PCT/CN2019/085437, filed May 5, 2019, and claims the priority of Chinese Application No. 2019102489547, filed Mar. 29, 2019.

TECHNICAL FIELD

The present disclosure relates to the technical field of micro-electromechanical systems, in particular to a method of manufacturing a piezoelectric thin film resonator on a non-silicon substrate.

BACKGROUND

Piezoelectric thin film resonator is a novel micro-electromechanical system device developed in recent years. At present, such devices are used in constructing GHz frequency band radio frequency filters and high-sensitivity biochemical sensors. With small size and high Q value, a film bulk acoustic device is very suitable for use in flexible communication circuits as a filter element, or in microfluidic chips or wearable electronic systems as a high-sensitivity sensor element. According to its standing wave resonance principle, it is necessary to construct a free-standing structure or a Bragg acoustic reflection layer under a piezoelectric oscillator. Usually, such structure adopts bulk silicon/surface silicon technique of silicon-based conductor manufacturing technology or is subjected to periodic multi-layer thin film deposition on a silicon substrate. Obviously, the current device techniques cannot be compatible with the manufacturing techniques with a non-silicon material such as polydimethylsiloxane (PDMS), plastic, glass and so on as a substrate in the flexible electronics and microfluidic devices.

At present, there are two major classes of methods of manufacturing a piezoelectric thin film resonator on a non-silicon substrate.

In the first class of methods, a piezoelectric thin film resonator is directly manufactured and peeled on a flexible substrate or on a flexible thin film on a silicon substrate. For example, a Chinese patent with publication number CN 103929149 A provides a flexible piezoelectric film bulk acoustic resonator and a preparation method thereof. By this method, a bottom electrode, a piezoelectric thin film and a top electrode layer are deposited directly on a flexible substrate so as to construct a film bulk acoustic resonator.

For another example, a paper entitled "Film bulk acoustic resonators integrated on arbitrary substrates using a polymer support layer" published in Page 9510, Volume 5, of Periodical SCIENTIFIC REPORTS in March 2015 provides a method comprising the following steps: (1) etching out a trench on a silicon substrate; (2) directly coating polyimide onto the silicon substrate; (3) manufacturing a film bulk acoustic resonator on a polyimide surface; (4) peeling the device on the silicon substrate.

An invention patent with publication number 106788318A discloses a method of manufacturing a film bulk acoustic resonator on a flexible substrate, comprising the following steps: (1) coating a water-soluble macromolecular polymer film layer and a polyimide film layer sequentially on a silicon substrate; (2) manufacturing a film bulk acoustic resonator structure above the polyimide film layer; (3) making a metal column on an electrode surface on the film bulk acoustic resonator; (4) coating a polymethyl methacrylate film layer on the electrode surface on the film bulk acoustic resonator; (5) coating and curing adhesive of the used flexible substrate on the silicon substrate; (6) placing the entire structure into water to separate the device from the silicon substrate; (7) removing the metal column with a corrosive liquid; (8) placing the device into acetone solution to dissolve the polymethyl methacrylate film layer so as to form an air gap; (9) removing the polyimide film layer under the film bulk acoustic resonator.

In the other class of methods, a piezoelectric thin film resonator is manufactured on a silicon substrate and then transferred to a non-silicon substrate such as a flexible material. For example, a paper entitled "A flexible, gigahertz, and free-standing thin film piezoelectric MEMS resonator with high figure of merit" published on Page 023505, Volume 111, of the periodical APPLIED PHYSICS LETTERS in 2017 provides a method in which a piezoelectric thin film resonator of air gap structure on a silicon substrate is transferred by mainly using a polymer stamp to a flexible substrate, where the air gap structure is manufactured on the flexible substrate to realize free standing of the resonator.

The above two classes of methods have the following major disadvantages: in the first class of methods, the flexible substrate has a poor hardness, and thus the processing precision and the thin film quality will be affected if the device is directly manufactured on the flexible substrate. The problem of processing precision and the thin film quality can be solved by coating polyimide onto the silicon substrate before manufacturing the device. However, the kinds of the flexible substrates available will be limited. Further, the manufactured film bulk acoustic resonator will be subjected to performance attenuation due to acoustic dissipation resulting from direct contact of one side of the film bulk acoustic resonator with the thick flexible substrate. In the second class of methods, the transferred device surface and a target surface need to be treated before use of the polymer stamp to control a bonding force. In this case, it is possible to damage existing chemical functional groups on the device or substrate surface and thus the polymer stamp is difficult to use for some substrates. Further, there are several disadvantages of non-uniform pressure control of large-area polymer stamp, a limited number of devices in one transfer, and easy damage to fine structures.

SUMMARY

In order to solve the shortcomings and defects in the prior art, the present disclosure provides a method of manufacturing a piezoelectric thin film resonator on a non-silicon substrate.

The present disclosure adopts the following technical solution.

A method of manufacturing a piezoelectric thin film resonator on a non-silicon substrate includes the following steps:

(1) depositing a copper thin film on a silicon wafer;

(2) coating a photoresist on the copper thin film to perform photoetching so as to remove photoresist in an air gap region under the piezoelectric thin film resonator to be disposed;

(3) electroplating-depositing a copper layer and then removing the photoresist to obtain a stepped peel sacrifice layer;

(4) coating polyimide to perform imidization through heat treatment as a support layer of the piezoelectric thin film resonator;

(5) making a sandwich structure of the piezoelectric thin film resonator above the polyimide layer;

(6) performing etching, through oxygen plasma, for the polyimide layer in a region not covered by the piezoelectric thin film resonator;

(7) placing the device obtained at step (6) into a copper corrosion solution to dissolve the copper around and under the piezoelectric thin film resonator, and attaching a drum coated with polyvinyl alcohol glue onto the piezoelectric thin film resonator to release and peel the piezoelectric thin film resonator including the polyimide support layer from the silicon wafer;

(8) transferring the piezoelectric thin film resonator including the polyimide support layer onto the desired non-silicon substrate; and (9) washing the drum with hot water to separate the drum from the piezoelectric thin film resonator so as to complete the making process.

In the above solution, the copper corrosion solution in step (7) does not have corrosion effect on the piezoelectric thin film resonator.

Preferably, a thickness of the copper thin film in step (1) is 200-500 nm.

Preferably, the copper thin film in step (1) is deposited by magnetron sputtering.

Preferably, titanium is sputter-deposited on the silicon wafer before copper sputtering.

Preferably, a thickness of the electroplating-deposited copper layer is 1.5-3 times a sum of thicknesses of a piezoelectric thin film, an upper electrode and a lower electrode in the piezoelectric thin film resonator.

Preferably, a thickness of the polyimide layer is 3-5 times the thickness of the electroplating-deposited copper layer.

Preferably, the polyimide heat treatment is performed in an atmosphere of vacuum or nitrogen with a heat treatment temperature being 250-400° C.

Preferably, the non-silicon substrate is malleable macromolecular organic matter, cloth, silk fabric, rubber or medical adhesive cloth.

Preferably, the malleable macromolecular organic matter is polydimethylsiloxane, polyurethane, acrylic ester, polyethylene terephthalate, acrylic acid, polyvinyl alcohol, pectin, or polyethylene naphthalate.

Preferably, the hot water in step (9) has a temperature of 50-90° C.

The present disclosure has the following beneficial effects.

(1) Performing major device preparation process on the silicon substrate can improve the processing precision and the piezoelectric thin film quality, and the air gap region made under the piezoelectric thin film resonator increases the device performances at the same time. (2) The device can be transferred by use of the drum with the polyimide as the support layer. In this case, there are advantages of no need of accurately controlling the bonding force, a larger number of devices in one transfer, no damage to the device surface, thus bringing high reliability.

Numerals of drawings are described as follows: 101 piezoelectric thin film, 102 upper electrode, 103 lower electrode, 104 electrode, 201 silicon wafer, 202 copper thin film 203 photoresist, 204 copper layer, 205 polyimide layer, 206 sandwich structure of a piezoelectric thin film resonator, 207 drum, and 208 non-silicon substrate.

DETAILED DESCRIPTION OF THE EMBODIMENTS

The present disclosure will be specifically described below in combination with accompanying drawings.

Figure 1:
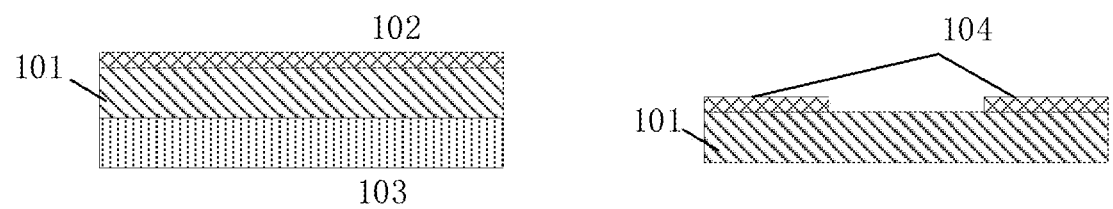
FIG. 1 is a schematic diagram of structures of two typical piezoelectric thin film resonators (a sandwich structure of a piezoelectric thin film resonator on the left; a parallel electrode structure of a piezoelectric thin film resonator on the right).

The present disclosure may be applied to manufacture piezoelectric thin film resonators of different structures without requirements for material, structure, electrode shape of the piezoelectric thin film resonators. FIG. 1 shows structures of two typical piezoelectric thin film resonators, for example, a film bulk acoustic resonator of a sandwich structure including a piezoelectric thin film 101, an upper electrode 102 and a lower electrode 103, where the upper electrode 102 and the lower electrode 103 are disposed on two sides of the piezoelectric thin film 101; and a piezoelectric thin film resonator of a parallel electrode structure including the piezoelectric thin film 101 and an electrode 104 disposed above the piezoelectric thin film 101. The electrode may be in a shape such as square, circular, annular, inter-digital or another irregular shape. The piezoelectric thin film may be made of any piezoelectric material such as zinc oxide, aluminum nitride, lead zirconate titanate and the like that are currently applied to film bulk acoustic resonators.

The use method of the present disclosure will be described below with the major steps of manufacturing a piezoelectric thin film resonator on a non-silicon substrate shown in FIG. 2 as an example.

Example 1

Figure 2:
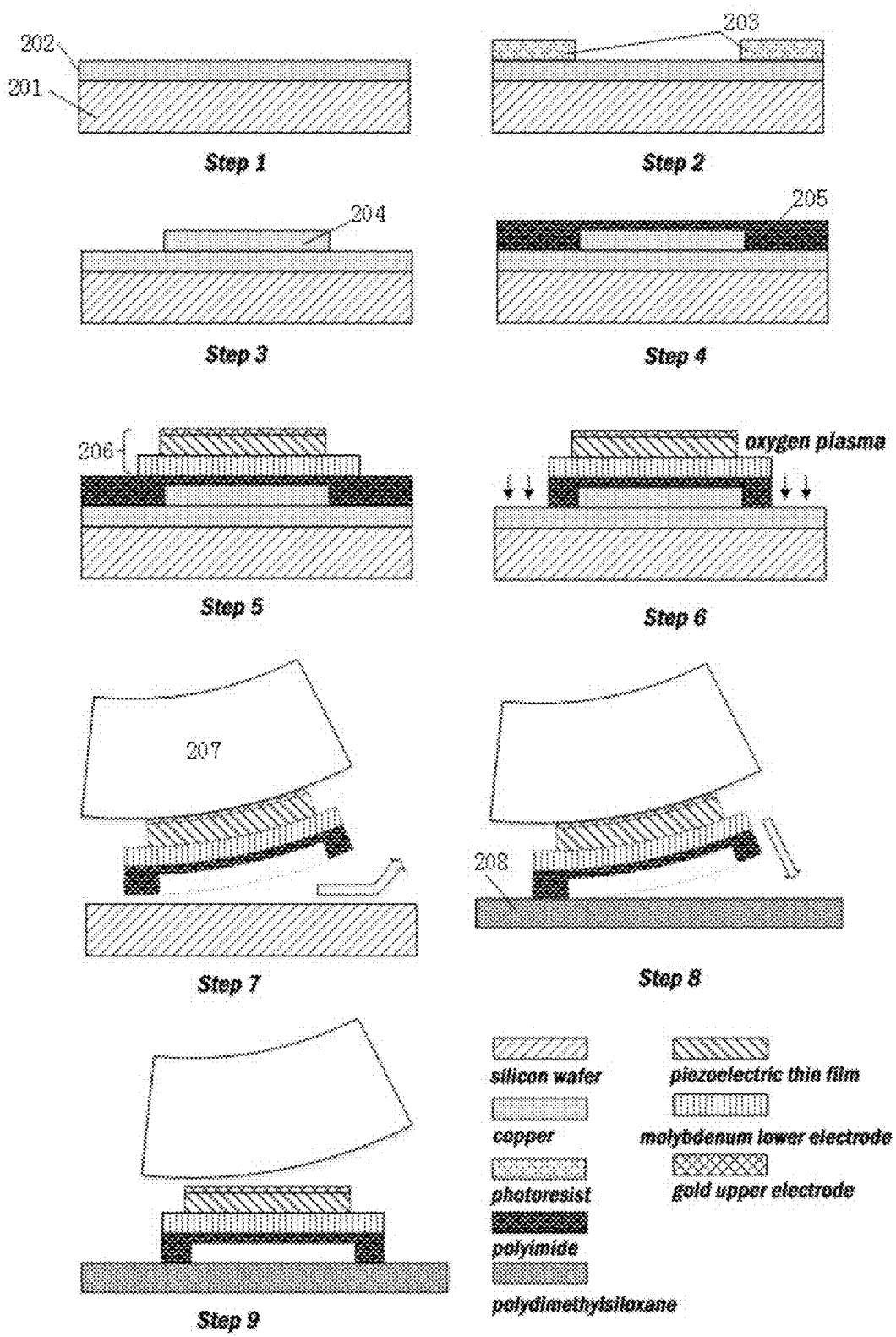
FIG. 2 is a schematic diagram of major steps of manufacturing a piezoelectric thin film resonator on a non-silicon substrate.

As shown in FIG. 2, a piezoelectric thin film resonator is manufactured on a polydimethylsiloxane (PDMS) substrate. The piezoelectric thin film resonator to be manufactured is of a sandwich structure, where the material of the upper electrode is gold with a thickness of 150 nanometers, the material of the lower electrode is molybdenum with a thickness of 300 nanometers, and the material of the piezoelectric thin film is aluminum nitride with a thickness of 1 micron.

At step 1, a copper thin film 202 was deposited as an electroplating seed layer on a silicon wafer 201 by use of magnetron sputtering, and the thickness of the copper thin film was 300 nanometers. In order to increase a bonding force of the copper and the silicon wafer, 10 nanometers of titanium were sputtered on the silicon wafer before copper sputtering.

At step 2, photoresist 203 was coated onto the copper thin film 202 to perform photoetching so as to remove photoresist in an air gap region under the piezoelectric thin film resonator to be disposed, where a thickness of the photoresist was 2 microns.

At step 3, a copper layer 204 was electroplating-deposited and then the photoresist was removed using acetone to obtain a stepped peel sacrifice layer. During the electroplating deposition process, a thickness of the copper growth was controlled to be consistent with a height of the photoresist 203 and may be finely adjusted through chemical mechanical polishing.

At step 4, a polyimide layer 205 with a thickness of 6 microns was coated in the following process: using photosensitive polyimide adhesive to perform spin-coating for 30 seconds at a speed of 3000 rpm and performing hot plate treatment for 5 minutes at a temperature of 130° C. Further, heat treatment was performed for 30 minutes at a treatment temperature of 300° C. in vacuum.

At step 5, a sandwich structure 206 of the piezoelectric thin film resonator was made above the polyimide layer 205. The upper electrode and the lower electrode of the sandwich structure 206 of the piezoelectric thin film resonator were both manufactured by direct current sputtering and patterned by lift-off process. The piezoelectric thin film was manufactured using an aluminum target by radio frequency reactive sputtering in a sputtering atmosphere of mixed gases of argon and nitrogen. The aluminum nitride piezoelectric thin film was patterned by use of a chlorine-based gas reactive ion etching.

At step 6, the polyimide layer in a region not covered by the piezoelectric thin film resonator was etched by oxygen plasma. The etching process is as follows: an oxygen pressure is 1 Pa, a power is 3 W/cm$^2$, and an etching time is 15 minutes.

At step 7, the device obtained at step 6 was placed into 10% ferric chloride solution to dissolve the copper around and under the piezoelectric thin film resonator. A small amount of polyvinyl alcohol glue was coated onto a plastic drum 207 with a length approximate to a diameter of the silicon wafer 201 to gradually spin-peel the piezoelectric thin film resonator including the polyimide support layer from the silicon wafer 201 by starting from a side of the silicon wafer 201, and afterwards, the device on the entire silicon wafer area was curled onto the drum 207.

At step 8, the piezoelectric thin film resonator including the polyimide support layer curled on the drum 207 was transferred to a non-silicon substrate 208 of polydimethylsiloxane (PDMS). Adhesive may be coated onto a surface of the non-silicon substrate 208 in advance to increase a bonding force as required.

At step 9, a contact surface between the drum 207 and the piezoelectric thin film resonator was washed by injecting 70° C. hot water with an injector to separate them. Thus, the manufacturing process was completed.

Example 2

As shown in FIG. 2, a piezoelectric thin film resonator is manufactured on a non-woven fabric substrate. The piezoelectric thin film resonator to be manufactured is of a sandwich structure, where the material of the upper electrode is gold with a thickness of 200 nanometers, the material of the lower electrode is molybdenum with a thickness of 300 nanometers, and the material of the piezoelectric thin film is zinc oxide with a thickness of 1 micron.

At step 1, the copper thin film 202 was deposited as an electroplating seed layer on the silicon wafer 201 by use of magnetron sputtering, and the thickness of the copper thin film was 300 nanometers. In order to increase a bonding force of the copper and the silicon wafer, 10 nanometers of titanium were sputtered on the silicon wafer before copper sputtering.

At step 2, the photoresist 203 was coated onto the copper thin film 202 to perform photoetching so as to remove photoresist in an air gap region under the piezoelectric thin film resonator to be disposed, where a thickness of the photoresist was 2 microns.

At step 3, the copper layer 204 was electroplating-deposited and then the photoresist was removed using acetone to obtain a stepped peel sacrifice layer. During the electroplating deposition process, a thickness of the copper growth was controlled to be consistent with a height of the photoresist 203 and may be finely adjusted through chemical mechanical polishing.

At step 4, the polyimide layer 205 with a thickness of 8 microns was coated in the following process: using photosensitive polyimide adhesive to perform spin-coating for 30 seconds at a speed of 2500 rpm and performing hot plate treatment for 5 minutes at a temperature of 130° C. Further, heat treatment was performed for 40 minutes at a treatment temperature of 250° C. in vacuum.

At step 5, the sandwich structure 206 of the piezoelectric thin film resonator was made above the polyimide layer 205. The upper electrode and the lower electrode of the sandwich structure 206 of the piezoelectric thin film resonator were both manufactured by direct current sputtering and patterned by lift-off process. The piezoelectric thin film was manufactured using an aluminum target by radio frequency reactive sputtering in a sputtering atmosphere of mixed gases of argon and nitrogen. The aluminum nitride piezoelectric thin film was patterned by use of a chlorine-based gas reactive ion etching.

At step 6, the polyimide layer in a region not covered by the piezoelectric thin film resonator was etched by oxygen plasma. The etching process is as follows: an oxygen pressure is 1 Pa, a power is 3 W/cm$^2$, and an etching time is 15 minutes.

At step 7, the device obtained at step 6 was placed into 10% ferric chloride solution to dissolve the copper around and under the piezoelectric thin film resonator. A small amount of polyvinyl alcohol glue was coated onto a plastic drum 207 with a length approximate to a diameter of the silicon wafer 201 to gradually spin-peel the piezoelectric thin film resonator including the polyimide support layer from the silicon wafer 201 by starting from a side of the silicon wafer 201, and afterwards, the device on the entire silicon wafer area was curled onto the drum 207.

At step 8, the piezoelectric thin film resonator including the polyimide support layer curled on the drum 207 was transferred to the non-silicon substrate 208 of non-woven fabric. Adhesive may be coated onto a surface of the non-silicon substrate 208 in advance to increase a bonding force as required.

At step 9, a contact surface between the drum 207 and the piezoelectric thin film resonator was washed by injecting 50° C. hot water with an injector to separate them. Thus, the manufacturing process was completed.

Example 3

As shown in FIG. 2, a piezoelectric thin film resonator is manufactured on a silk fabric substrate. The piezoelectric thin film resonator to be manufactured is of a sandwich structure, where the material of the upper electrode is gold with a thickness of 100 nanometers, the material of the lower electrode is molybdenum with a thickness of 300 nanometers, and the material of the piezoelectric thin film is aluminum nitride with a thickness of 1.5 microns.

At step 1, the copper thin film 202 was deposited as an electroplating seed layer on the silicon wafer 201 by use of magnetron sputtering, and the thickness of the copper thin film was 300 nanometers. In order to increase a bonding force of the copper and the silicon wafer, 10 nanometers of titanium were sputtered on the silicon wafer before copper sputtering.

At step 2, the photoresist 203 was coated onto the copper thin film 202 to perform photoetching so as to remove photoresist in an air gap region under the piezoelectric thin film resonator to be disposed, where a thickness of the photoresist was 3 microns.

At step 3, the copper layer 204 was electroplating-deposited and then the photoresist was removed using acetone to obtain a stepped peel sacrifice layer. During the electroplating deposition process, a thickness of the copper growth was controlled to be consistent with a height of the photoresist 203 and may be finely adjusted through chemical mechanical polishing.

At step 4, the polyimide layer 205 with a thickness of 6 microns was coated in the following process: using photosensitive polyimide adhesive to perform spin-coating for 30 seconds at a speed of 3000 rpm and performing hot plate treatment for 5 minutes at a temperature of 130° C. Further, heat treatment was performed for 40 minutes at a treatment temperature of 250° C. in vacuum.

At step 5, the sandwich structure 206 of the piezoelectric thin film resonator was made above the polyimide layer 205. The upper electrode and the lower electrode of the sandwich structure 206 of the piezoelectric thin film resonator were both manufactured by direct current sputtering and patterned by lift-off process. The piezoelectric thin film was manufactured using an aluminum target by radio frequency reactive sputtering in a sputtering atmosphere of mixed gases of argon and nitrogen. The aluminum nitride piezoelectric thin film was patterned by use of a chlorine-based gas reactive ion etching.

At step 6, the polyimide layer in a region not covered by the piezoelectric thin film resonator was etched by oxygen plasma. The etching process is as follows: an oxygen pressure is 1 Pa, a power is 3 W/cm$^2$, and an etching time is 15 minutes.

At step 7, the device obtained at step 6 was placed into 10% ferric chloride solution to dissolve the copper around and under the piezoelectric thin film resonator. A small amount of polyvinyl alcohol glue was coated onto the plastic drum 207 with a length approximate to a diameter of the silicon wafer 201 to gradually spin-peel the piezoelectric thin film resonator including the polyimide support layer from the silicon wafer 201 by starting from a side of the silicon wafer 201, and afterwards, the device on the entire silicon wafer area was curled onto the drum 207.

At step 8, the piezoelectric thin film resonator including the polyimide support layer curled on the drum 207 was transferred to the non-silicon substrate 208 of silk fabric. Adhesive may be coated onto a surface of the non-silicon substrate 208 in advance to increase a bonding force as required.

At step 9, a contact surface between the drum 207 and the piezoelectric thin film resonator was washed by injecting 90° C. hot water with an injector to separate them. Thus, the manufacturing process was completed.

Example 4

As shown in FIG. 2, a piezoelectric thin film resonator is manufactured on an acrylic ester substrate. The piezoelectric thin film resonator to be manufactured is of a sandwich structure, where the material of the upper electrode is gold with a thickness of 150 nanometers, the material of the lower electrode is molybdenum with a thickness of 300 nanometers, and the material of the piezoelectric thin film is zinc oxide with a thickness of 2 microns.

At step 1, the copper thin film 202 was deposited as an electroplating seed layer on the silicon wafer 201 by use of magnetron sputtering, and the thickness of the copper thin film was 300 nanometers. In order to increase a bonding force of the copper and the silicon wafer, 10 nanometers of titanium were sputtered on the silicon wafer before copper sputtering.

At step 2, the photoresist 203 was coated onto the copper thin film 202 to perform photoetching so as to remove photoresist in an air gap region under the piezoelectric thin film resonator to be disposed, where a thickness of the photoresist was 4 microns.

At step 3, the copper layer 204 was electroplating-deposited and then the photoresist was removed using acetone to obtain a stepped peel sacrifice layer. During the electroplating deposition process, a thickness of the copper growth was controlled to be consistent with a height of the photoresist 203 and may be finely adjusted through chemical mechanical polishing.

At step 4, the polyimide layer 205 with a thickness of 12 microns was coated in the following process: using photosensitive polyimide adhesive to perform spin-coating for 30 seconds at a speed of 1500 rpm and performing hot plate treatment for 5 minutes at a temperature of 130° C. Further, heat treatment was performed for 40 minutes at a treatment temperature of 250° C. in vacuum.

At step 5, the sandwich structure 206 of the piezoelectric thin film resonator was made above the polyimide layer 205. The upper electrode and the lower electrode of the sandwich structure 206 of the piezoelectric thin film resonator were both manufactured by direct current sputtering and patterned by lift-off process. The piezoelectric thin film was manufactured using an aluminum target by radio frequency reactive sputtering in a sputtering atmosphere of mixed gases of argon and nitrogen. The aluminum nitride piezoelectric thin film was patterned by use of a chlorine-based gas reactive ion etching.

At step 6, the polyimide layer in a region not covered by the piezoelectric thin film resonator was etched by oxygen plasma. The etching process is as follows: an oxygen pressure is 1 Pa, a power is 3 W/cm$^2$, and an etching time is 15 minutes.

At step 7, the device obtained at step 6 was placed into 10% ferric chloride solution to dissolve the copper around and under the piezoelectric thin film resonator. A small amount of polyvinyl alcohol glue was coated onto the plastic drum 207 with a length approximate to a diameter of the silicon wafer 201 to gradually spin-peel the piezoelectric thin film resonator including the polyimide support layer from the silicon wafer 201 by starting from a side of the silicon wafer 201, and afterwards, the device on the entire silicon wafer area was curled onto the drum 207.

At step 8, the piezoelectric thin film resonator including the polyimide support layer curled on the drum 207 was transferred to the non-silicon substrate 208 of acrylic ester. Adhesive may be coated onto a surface of the non-silicon substrate 208 in advance to increase a bonding force as required.

At step 9, a contact surface between the drum 207 and the piezoelectric thin film resonator was washed by injecting 80° C. hot water with an injector to separate them. Thus, the manufacturing process was completed.

Parts not mentioned in the present disclosure may be realized by employing the prior art.

Of course, the preceding descriptions are not intended to limit the present disclosure and the present disclosure is not limited to the above examples. Changes, modifications, additions or substitutions made by those skilled in the art without departing from the essence of the present disclosure shall fall within the scope of protection of the present disclosure.

The invention claimed is:

1. A method of manufacturing a piezoelectric thin film resonator on a non-silicon substrate, comprising the following steps:

(1) depositing a copper thin film on a silicon wafer;

(2) coating a photoresist on the copper thin film to perform photoetching so as to remove photoresist in an air gap region to be disposed under the piezoelectric thin film resonator;

(3) electroplating-depositing a copper layer and then removing the photoresist to obtain a stepped peel sacrifice layer;

(4) coating polyimide to perform imidization through heat treatment as a support layer of the piezoelectric thin film resonator;

(5) making a sandwich structure of the piezoelectric thin film resonator above the polyimide layer;

(6) performing etching, through oxygen plasma, for the polyimide layer in a region not covered by the piezoelectric thin film resonator;

(7) placing the device obtained at step (6) into a copper corrosion solution to dissolve the copper thin film and the copper layer around and under the piezoelectric thin film resonator, and attaching a drum coated with polyvinyl alcohol glue onto the piezoelectric thin film resonator to release and peel the piezoelectric thin film resonator including the polyimide support layer from the silicon wafer;

(8) transferring the piezoelectric thin film resonator including the polyimide support layer onto a desired non-silicon substrate;

(9) washing the drum with hot water to separate the drum from the piezoelectric thin film resonator so as to complete the making process.

2. The method of manufacturing a piezoelectric thin film resonator on a non-silicon substrate according to claim 1, wherein the copper thin film in step (1) has a thickness of 200-500 nm.

3. The method of manufacturing a piezoelectric thin film resonator on a non-silicon substrate according to claim 1, wherein the copper thin film in step (1) is deposited by magnetron sputtering.

4. The method of manufacturing a piezoelectric thin film resonator on a non-silicon substrate according to claim 3, wherein titanium is sputter-deposited on the silicon wafer before copper sputtering is performed.

5. The method of manufacturing a piezoelectric thin film resonator on a non-silicon substrate according to claim 1, wherein a thickness of the electroplating-deposited copper layer is 1.5-3 times the sum of thicknesses of a piezoelectric thin film, an upper electrode and a lower electrode in the piezoelectric thin film resonator.

6. The method of manufacturing a piezoelectric thin film resonator on a non-silicon substrate according to claim 5, wherein a thickness of the polyimide layer is 3-5 times the thickness of the electroplating-deposited copper layer.

7. The method of manufacturing a piezoelectric thin film resonator on a non-silicon substrate according to claim 1, wherein the polyimide heat treatment is performed in an atmosphere of vacuum or nitrogen with a heat treatment temperature being 250-400° C.

8. The method of manufacturing a piezoelectric thin film resonator on a non-silicon substrate according to claim 1, wherein the non-silicon substrate is malleable macromolecular organic matter, cloth, silk fabric, rubber or medical adhesive cloth.

9. The method of manufacturing a piezoelectric thin film resonator on a non-silicon substrate according to claim 8, wherein the malleable macromolecular organic matter is polydimethylsiloxane, polyurethane, acrylic ester, polyethylene terephthalate, acrylic acid, polyvinyl alcohol, pectin, or polyethylene naphthalate.

10. The method of manufacturing a piezoelectric thin film resonator on a non-silicon substrate according to claim 8, wherein the hot water in step (9) has a temperature of 50-90° C.

* * * * *